United States Patent
Ishikawa (12)

(10) Patent No.: US 6,277,706 B1
(45) Date of Patent: *Aug. 21, 2001

(54) METHOD OF MANUFACTURING ISOLATION TRENCHES USING SILICON NITRIDE LINER

(75) Inventor: Hiraku Ishikawa, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/093,383

(22) Filed: Jun. 8, 1998

(30) Foreign Application Priority Data

Jun. 13, 1997 (JP) .................................................. 9-156256

(51) Int. Cl.[7] .................................................. H01L 21/76
(52) U.S. Cl. .................... 438/424; 438/404; 438/428; 438/435; 438/436; 438/438
(58) Field of Search .................................. 438/424, 422, 438/423, 425–428, 435, 437, 439, 438, 404, 218–221, 248, 294–297, 318, 353, 355, 391

(56) References Cited

U.S. PATENT DOCUMENTS

| 4,455,325 | * | 6/1984 | Razouk ................................ 438/701 |
| 5,492,858 | * | 2/1996 | Bose et al. ........................... 438/437 |
| 5,506,177 | * | 4/1996 | Kishimoto et al. .................. 438/624 |
| 5,817,566 | * | 10/1998 | Jang et al. ........................... 438/424 |
| 5,911,109 | * | 6/1999 | Razouk et al. ....................... 438/424 |
| 5,933,748 | * | 8/1999 | Chou et al. .......................... 438/431 |

FOREIGN PATENT DOCUMENTS

| 60124840 | 7/1985 | (JP) ............................. H01L/21/76 |
| 1-128527 | 5/1989 | (JP) ............................ H01L/21/302 |
| 6-252259 | 9/1994 | (JP) ............................. H01L/21/76 |
| 786393 | 3/1995 | (JP) ............................. H01L/21/76 |

* cited by examiner

Primary Examiner—John F. Niebling
Assistant Examiner—Ha Tran Nguyen
(74) Attorney, Agent, or Firm—Hayes, Soloway, Hennessey, Grossman & Hage, PC

(57) ABSTRACT

In fabrication of a semiconductor device, firstly an isolation trench is formed on a substrate to isolate a plurality of semiconductor elements, and then a thermal oxide film is formed on a sidewall of the trench, whereupon a silicon oxide film is formed on the substrate by chemical vapor deposition. Finally the entire substrate is annealed in a high-pressure ambient.

14 Claims, 4 Drawing Sheets

- 4: trench
- 3: silicon nitride film
- 2: thermal oxide film
- 1A: thermal oxide film
- 1: substrate

- 5: silicon oxide film by CVD

17; silicon oxide film by CVD

METHOD OF MANUFACTURING ISOLATION TRENCHES USING SILICON NITRIDE LINER

BACKGROUND OF THE INVENTION

1. Field of the Invention

The present invention relates to a method of manufacturing a semiconductor device and more particularly to a method of manufacturing a semiconductor device with circuit-element-isolation trenches on a substrate.

2. Description of the Related Art

With the recent increase of integration and operating speed of semiconductor devices, various technologies have been advanced remarkably to miniature individual circuit elements to be loaded on each semiconductor device, and application of the LOCOS (Local Oxidation of Silicon) isolation using a silicon nitride film for electrically isolating individual circuit elements has increasingly been limited.

Consequently new element isolation technologies utilizing trenches have been developed. For example, Japanese Patent Laid-Open Publication No. Sho60-124840 proposed a technology of forming trenches, filling an insulation film in the trenches and then annealing at a temperature equal to or below a melting point of a substrate.

Another solution was proposed by a paper "An Optimized Densification of the Filled Oxide for Quarter Micron Shallow Trench Isolation" presented in Symposium on VLSI technology Digest Technical Papers 1996 by Han Sim Lee, et al. This technology will now be described with reference to FIG. 4 of the accompanying drawings of the present specification.

As shown in FIG. 4, a number of predetermined trenches 104 are formed on a silicon substrate 101, and then a thermal oxide film 102 is formed on the inside walls of the trenches 104, whereupon a silicon oxide film 105 is filled in the trenches 104 by low pressure chemical vapor deposition (hereinafter also called LP-CVD) and is leveled by chemical and mechanical polishing (hereinafter called the CMP process).

In their paper, Lee, et al. disclosed that densification of the silicon oxide film, namely, resistance to wet etching was achieved by annealing at a lower temperature in a water-vapor ambient.

Lee, et al. also pointed out that since the inside walls of the trenches were oxidized, stresses occurred in the trenches to cause crystalline faults.

However, in this conventional technology, since the silicon oxide film used to fill the trenches by CVD was inadequately densified, the wet etching rate was great. Consequently, as shown in FIG. 4, after leveling by the CMP method, pits 106 occurred in the film filled in the trenches or a non-illustrated slit occurred centrally in the individual trench.

In the meantime, in order to improve the foregoing inconvenience, as an example, it is necessary to densify the silicon oxide film as by annealing at a high temperature equal to or higher than 1200° C. But if this technique was adopted, large thermal stresses would have occurred in the substrate to cause slippage and/or crystal faults.

Yet in this conventional technology, since densification by annealing is carried out at a low temperature, the inside walls of the trenches are oxidized so that large stresses occur in the trenches, thus causing faults in the substrate.

SUMMARY OF THE INVENTION

It is therefore an object of the present invention to provide a method of manufacturing a semiconductor device which method adequately densifies a trench-forming film at a low temperature using a high-pressure ambient can reduce occurrences of possible faults and, at the same time, can effectively isolate individual circuit elements from one another.

According to a first aspect of the invention, the above object is accomplished by a method of manufacturing a semiconductor device, comprising the steps of: forming on a substrate an isolation trench for isolating a plurality of semiconductor circuit elements; forming a thermal oxide film on a sidewall of the isolation trench formed in the trench-forming step; forming a silicon oxide film on the substrate by chemical vapor deposition (CVD); and annealing the silicon oxide film along with the substrate in a high-pressure ambient.

Preferably, the annealing of the CVD silicon oxide film and the substrate is carried out in a high-pressure ambient so that the silicon oxide film is densified at a lower temperature compared to normal-pressure ambient.

According to a second aspect of the invention, the above object is accomplished alternatively by a method of manufacturing a semiconductor device, comprising the steps of: forming on a substrate an isolation trench for isolating a plurality of semiconductor circuit elements; forming a thermal oxide film on a sidewall of the isolation trench formed in the trench-forming step; forming a silicon nitride film on the substrate; forming a silicon oxide film on the substrate by chemical vapor deposition (CVD); and annealing said silicon oxide film along with the substrate in a high-pressure ambient.

In the second aspect of the invention, like the first aspect of the invention, the annealing of the silicon oxide film and the substrate is carried out preferably in a high-pressure ambient so that the silicon oxide film is densified at a lower temperature compared to normal-pressure ambient. Also preferably, the high-pressure ambient contains water vapor.

According to a third aspect of the invention, the above object is accomplished yet alternatively by a method of manufacturing a semiconductor device, comprising the steps of: forming on a substrate an isolation trench for isolating a plurality of semiconductor circuit elements; forming a thermal oxide film on a sidewall of the isolation trench formed in the trench-forming step; forming a silicon nitride film on the thermal oxide film formed on the sidewall of the trench; forming a silicon oxide film on the substrate by chemical vapor deposition (CVD); and annealing the entire substrate in a high-pressure ambient.

In the third aspect of the invention, the second aspect of the invention, the annealing of the silicon oxide film and the substrate is carried out preferably in a high-pressure ambient so that the silicon oxide film is densified at a lower temperature compared to normal-pressure ambient. Yet preferably, the high-pressure ambient contains water vapor.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

Figure 1:
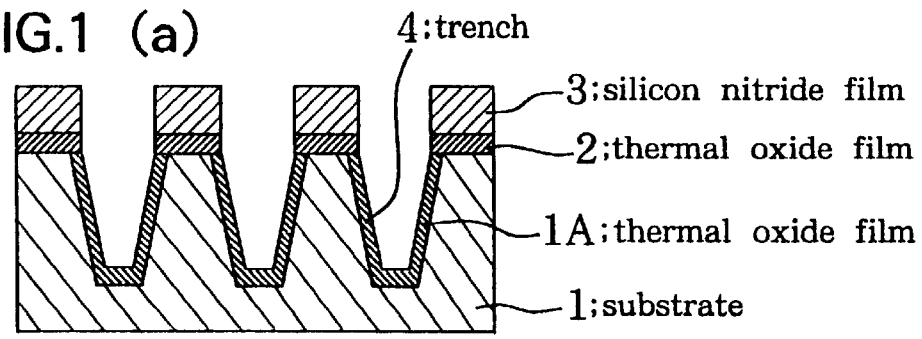
FIGS. 1(a) to 1(d) are schematic cross-sectional views showing sequential process steps of a semiconductor device fabrication method according to a first embodiment of the present invention.
Figure 1:
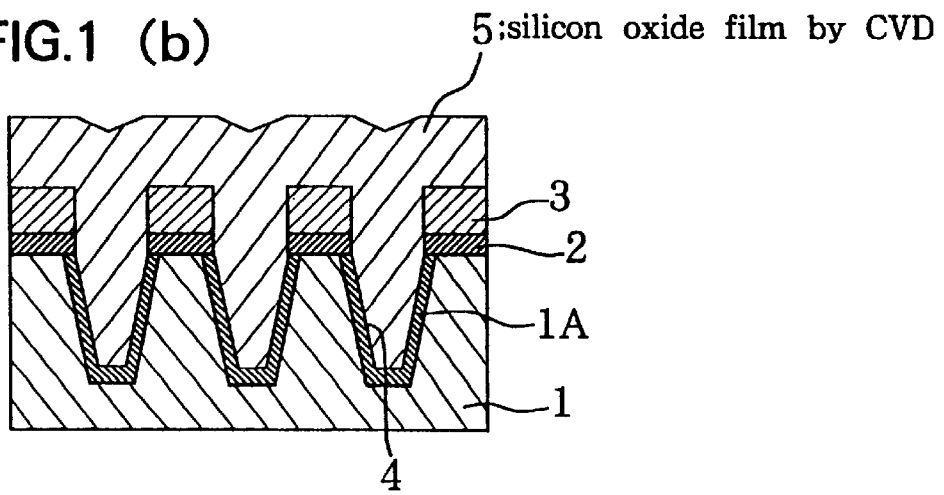
Figure 1:
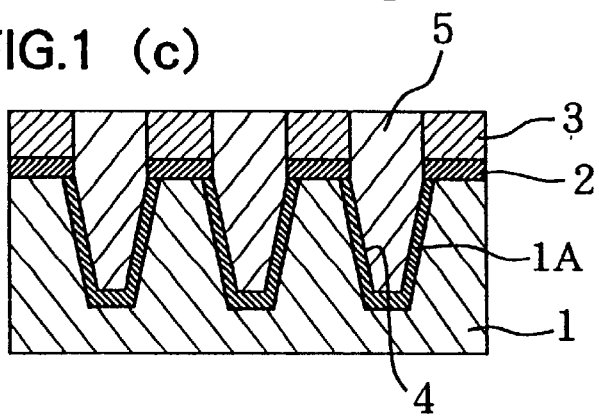
Figure 1:
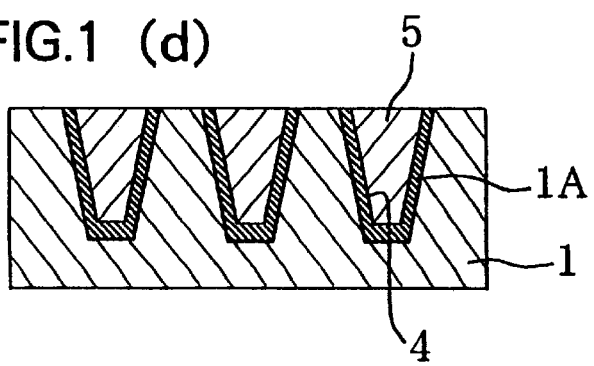

The principles of the present invention are particularly useful when applied to a method of manufacturing a semiconductor device, a couple of preferred embodiments of which will now be described with reference to the accompanying drawings.

In the preferred embodiments of the invention, with silicon oxide and nitride films, which are formed and patterned on a substrate, as a mask, trenches are formed between circuit elements, and then over the substrate a silicon oxide film is formed by CVD.

Then the silicon oxide film is densified in structure by annealing in a high-pressure ambient, and the resultant silicon oxide film is then flattened by the CMP process to leave the last-named silicon oxide film only in the trenches.

In the absence of the silicon nitride film on the trench sidewalls, the ambient to be used is preferably any of water vapor, oxygen, nitrogen, hydrogen and $N_2O$ or any combination of them.

First Embodiment

FIGS. 1(a) to 1(d) are schematic cross-sectional views showing sequential process steps of the semiconductor device fabrication method according to a first embodiment.

In this fabrication method, a silicon nitride film 3 is formed over a substrate 1 via a thermal oxide film 2. The silicon nitride film 3 and thermal oxide film 2 are patterned in a desired pattern of trenches by photolithography and dry etching.

Then with the silicon nitride film 3 as a mask, the silicon of the substrate 1 is dry-etched to form trenches 4 in a desired shape. After these trenches 4 have been formed, a thermal oxide film 1A for protection of the trenches 4 is formed on inside walls of the trenches 4 (FIG. 1(a)).

A silicon oxide film 5 is then formed over the substrate 1 by low pressure CVD to fill the trenches 4 (FIG. 1(b)).

Subsequently, in order to make it tight in structure, the silicon oxide film 5 is annealed in a high-pressure ambient devoid of either water vapor or oxygen.

During the annealing in such ambient, the silicon oxide film is in general a much viscous liquid and assumes a solid-like state when it is low in temperature like room temperature. As temperature rises, the viscosity is lowered and, about its melting point, the silicon oxide film takes a flowable characteristic liquid.

This lowering of viscosity occurs also in a relatively low temperature; for example, it is less than approximately $10^{12}$ poises at 1000° C. At that time, if pressure is exerted on the surface of the silicon oxide film, its structure will be rearranged.

Whereas under normal pressure, no force would exert from outside so that the structure will not be rearranged until it becomes higher in temperature. Accordingly, it is possible to make a smaller quantity of silicon oxide film tight in structure by annealing the silicon oxide film in a high-pressure ambient.

And since high-pressure annealing is carried out in an ambient free of either water vapor or oxygen, the silicon in the trenches would not be oxidized so that stresses inside the trenches due to the growth of the silicon oxide film on the trench sidewalls can be prevented from increasing.

After tightening of structure is done by annealing in a high-pressure ambient, flattening is done by the CMP process. At that time, the silicon nitride film 3 serves as a barrier layer against chemical and mechanical polishing so that optimum polishing can be secured (FIG. 1(c)).

This leveling by the CMP process takes place in a cleaning step using a solution containing fluoric acid. Consequently the adequately densified silicon oxide film 5 would lose its mass less causing no pits.

Then the silicon nitride film 3 used as a barrier layer is removed by a wet method or by dry etching using plasma, and the thermal oxide layer 2 also is removed (FIG. 1(d)).

Subsequently, also during washing with a solution containing fluoric acid in formation of a gate oxide film, this adequately densified silicon oxide film 5 would lose its mass less to become level or flat.

Embodiment 2

FIGS. 2(a) to 2(f) are schematic cross-sectional views showing sequential process steps of the semiconductor device fabrication method according to a second embodiment.

In this fabrication method, like the method of the first embodiment of FIG. 1, a first silicon nitride film 13 is formed over a sheet-like substrate 11 via a first thermal oxide film 12, whose thickness is 100 angstroms.

Then the first silicon nitride film 13 and the first thermal oxide film 12 are patterned in a desired pattern by photolithography and dry etching. Then with the first silicon nitride film 13 as a mask, the silicon of the substrate 11 is dry-etched to form trenches 14 in a desired shape. After these trenches 14 have been formed, a second thermal oxide film 11A for protection of the trenches 14 is formed over inside walls of the trenches 14 (FIG. 2(a)).

Figure 2:
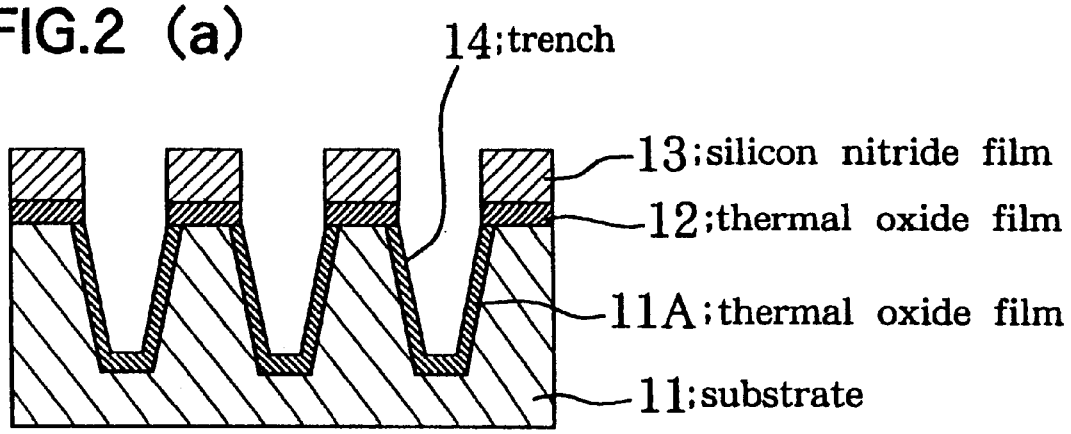
FIGS. 2(a) to 2(f) are schematic cross-sectional views showing sequential process steps of another semiconductor device fabrication method according to a second embodiment of the invention.
Figure 2:
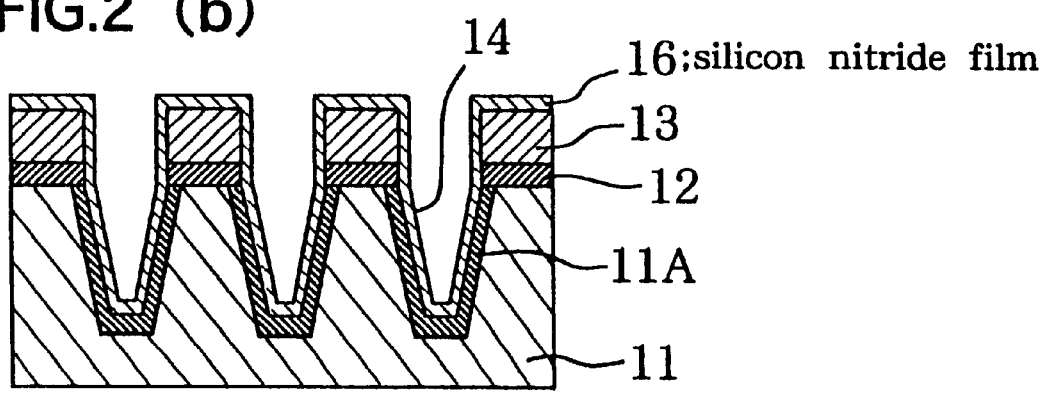
Figure 2:
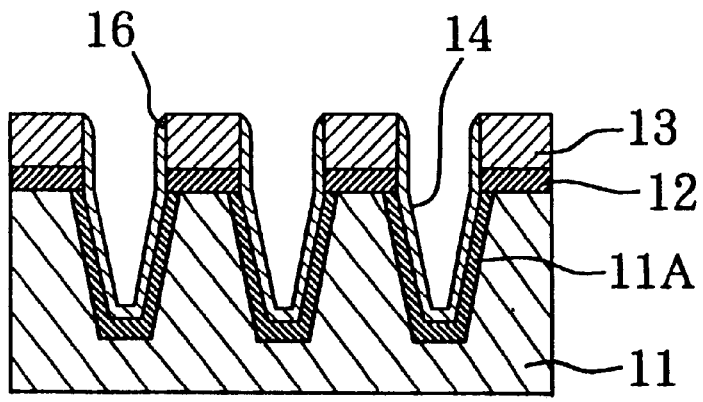
Figure 2:
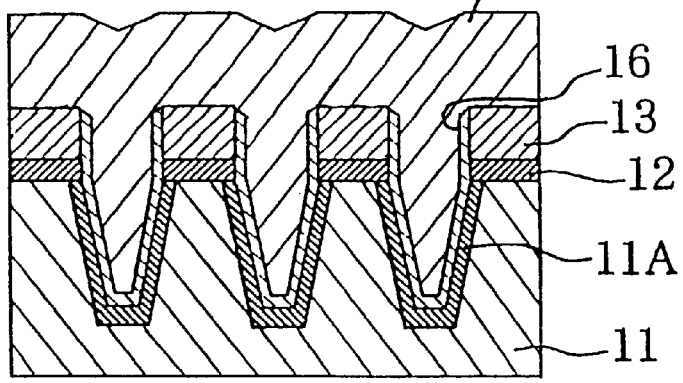
Figure 2:
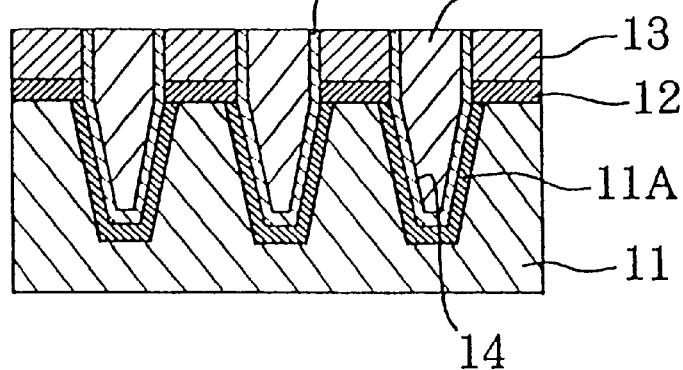
Figure 2:
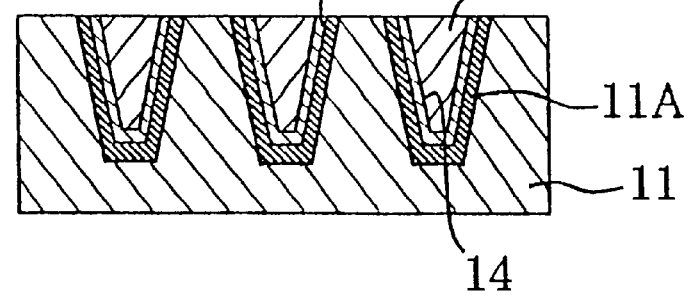

A second silicon nitride film 16 is then formed over the substrate 11 by low pressure CVD to cover the first silicon nitride film 13 and the second thermal oxide film 11A (FIG. 2(b)). At that time, if it is too thick, the second silicon nitride film 16 would be overetched to cause pits after chemical and mechanical polishing and, if it is too thin, the second silicon nitride film 16 would become less resistant to oxidation during annealing. Consequently the thickness of the second silicon nitride film 16 is preferably in the range of approximately 50 to 100 angstroms.

As shown in FIG. 2(c), the second silicon nitride film 16 is etched in such a manner that its portion left unetched covers only the inside walls of the trenches 14. This enables to reduce stresses to be exerted on the second silicon nitride film 16. Then a CVD silicon oxide film 17 is formed over the substrate 11 by low pressure CVD, filling the trenches 14 (FIG. 2(d)).

Subsequently, in order to densify it in structure, the silicon oxide film 17 is annealed in a high-pressure ambient containing water vapor.

Figure 3:
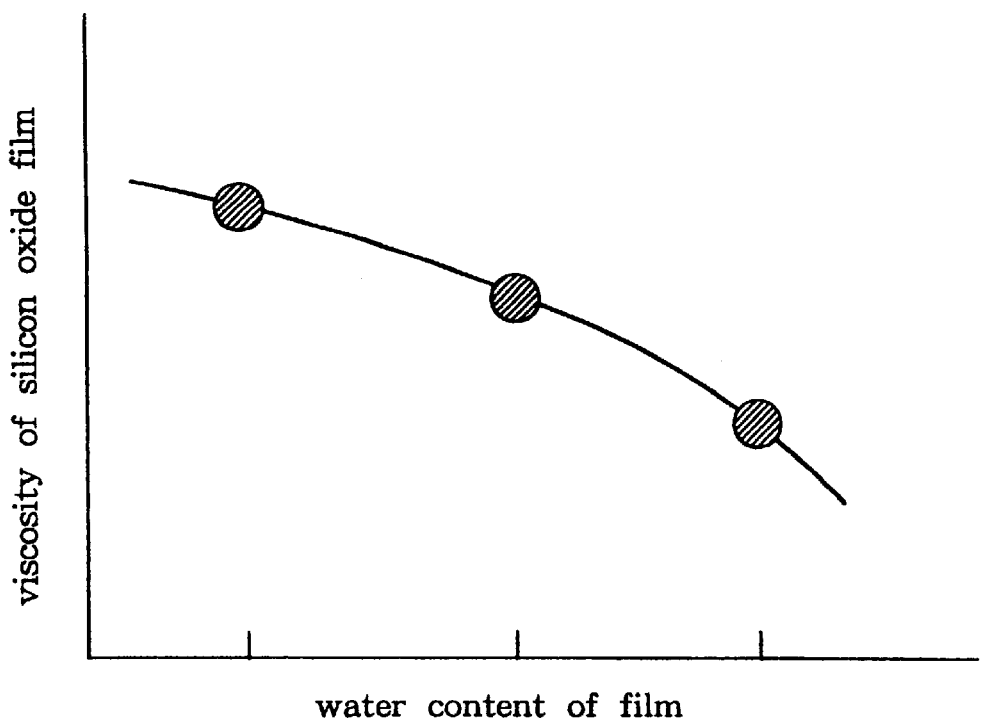
FIG. 3 is a characteristic graph showing dependency of the viscosity of a silicon oxide film on the water content in the film.
Figure 4:
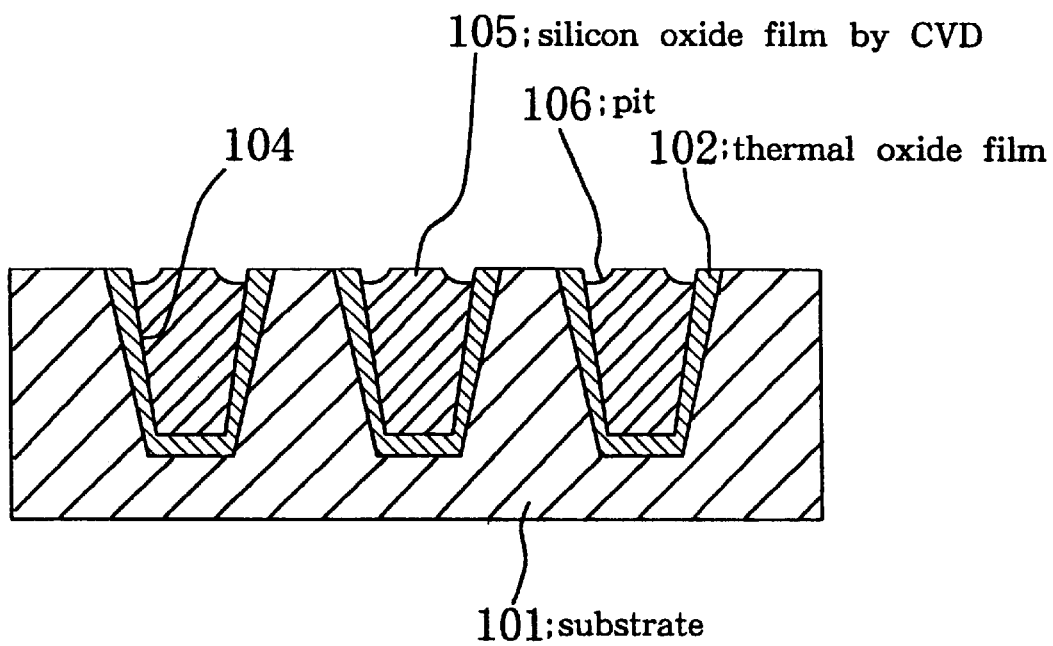
FIG. 4 shows the manner in which circuit elements are isolated from one another by trenches formed according to the conventional technology.

During the annealing in the water-vapor-containing ambient, a large quantity of water penetrates into the silicon oxide film 17. The relation between the water content of the silicon oxide film 17 and the viscosity of the same film is shown in a graph of FIG. 3. It turns out from the graph of FIG. 3 that with the increase of the water content, the silicon oxide film 17 becomes sharply less viscous.

Thus in the water-vapor-containing ambient, the silicon oxide film 17 can be softened at a low temperature. By adding a high pressure with the temperature restricted to a relatively low range, it is possible to make the silicon oxide film 17 adequately densified.

At that time the second silicon nitride film 16 on the inside walls of the trenches 14 serves to prevent oxidation of the silicon of the substrate 11 so that the internal stresses of the trenches due to the oxidation of silicon of their inside walls would not increase.

Subsequently, after being densified by annealing, the silicon oxide film 17 is leveled or flattened by the CMP process. At that time, the first silicon nitride 13 serves as a barrier layer during the chemical and mechanical polishing (CMP) process and, as a result, optimum polishing can be achieved (FIG. 2(e)).

In this case, during washing with a solution containing fluoric acid after chemical and mechanical polishing, the silicon oxide film 17 has already been adequately densified due to annealing and loses its mass less causing no pits.

Then the first silicon nitride film 13 used as a barrier layer is removed by a wet method or by dry etching using plasma, and the first thermal oxide film 12 is removed (FIG. 2(f)).

The adequately densified silicon oxide film 17 loses its mass less also while washing with a fluoric-acid-containing solution during a subsequent process of forming a gate oxide film, thus resulting in a smooth surface.

According to the semiconductor device of the present invention, since the silicon oxide film to be used in forming trenches by CVD is adequately densified by annealing in a high-pressure ambient, it is possible to completely eliminate pits, which would have occurred at opposite ends of the trench-forming film after leveling according to the conventional art. It is therefore possible to reduce occurrences of faults in the substrate and, at the same time, to surely isolate the individual circuit elements on the substrate.

In addition, given that the silicon nitride film is formed on the sidewalls of trenches, it is possible to prevent oxidation of silicon of the trench sidewalls much more effectively. It is therefore possible to avoid any possible stresses, which would have tended to occur in the trenches with the lapse of time, thus improving the durability of the whole device.

It is thus apparent that the present invention should by no means be limited to the illustrated embodiment and various modifications and changes may be suggested without departing from the scope and spirit of the invention.

Finally, the present application claims the priority of Japanese Patent Application No. Hei9-156256 filed on Jun. 13, 1997, which is herein incorporated by reference.

What is claimed is:

1. A method of manufacturing a semiconductor device, comprising the steps in sequence of:
   (a) forming on a substrate an isolation trench for isolating a plurality of semiconductor circuit elements;
   (b) forming a thermal oxide film on a sidewall of said isolation trench formed in said trench-forming step;
   (c) forming a silicon oxide film over the substrate to fill said isolation trench by chemical vapor deposition (CVD);
   (d) annealing the entire substrate at a temperature below 1200° C., in an atmosphere devoid of water vapor, and at an elevated pressure sufficient to cause rearrangement of and densification of the silicon oxide film wherein said silicon oxide film is exposed when annealed; and
   (e) leveling the silicon oxide film by chemical and mechanical polishing (CMP) in such a manner that the silicon oxide film remains only in the trench.

2. A method according to claim 1, wherein said annealing is conducted in an atmosphere containing a gas selected from the group consisting of nitrogen, hydrogen, an inert gas and a combination of one or more of said gases.

3. A method according to claim 1, wherein said silicon oxide film comprises an undoped silicon oxide film.

4. A method of manufacturing a semiconductor device, comprising the steps in sequence of:
   (a) forming on a substrate a pattern of isolation trenches for isolating a plurality of semiconductor circuit elements;
   (b) forming a thermal oxide film on sidewalls of said isolation trenches;
   (c) forming silicon nitride film on the substrate;
   (d) forming a silicon oxide film over the substrate to fill trenches by chemical vapor deposition (CVD);
   (e) annealing the entire substrate at a temperature below 1200° C., in an atmosphere devoid of water vapor and oxygen, and at an elevated pressure sufficient to cause rearrangement of and densification of the silicon oxide film wherein said silicon oxide film is exposed when annealed; and
   (f) leveling the silicon oxide film by chemical and mechanical polishing (CMP) in such a manner that the silicon oxide film remains only in the trenches.

5. A method according to claim 4, wherein said annealing is conducted in an atmosphere containing a gas selected from the group consisting of nitrogen, hydrogen, an inert gas and a combination of one or more of said gases.

6. A method according to claim 4, wherein said silicon nitride film serves as a barrier layer during said chemical and mechanical polishing (CMP) step.

7. A method according to claim 4, further comprising the step of washing the entire substrate with a solution containing fluoric acid, while carrying out said leveling by chemical and mechanical polishing (CMP).

8. A method according to claim 7, wherein after said washing step, the step of removing the silicon nitride film along with the thermal oxide film by wet etching or dry etching using plasma.

9. A method according to claim 4, wherein said silicon oxide film comprises an undoped silicon oxide film.

10. A method of manufacturing a semiconductor device, comprising the steps in sequence of:
    (a) forming on a substrate a pattern of isolation trenches for isolating a plurality of semiconductor circuit elements;
    (b) forming a thermal oxide film on sidewalls of said isolation trenches;
    (c) forming a silicon nitride film on said thermal oxide film formed on said sidewalls of said trenches;
    (d) forming silicon oxide film over the substrate to fill said isolation trenches by low pressure chemical vapor deposition (LP-CVD);

(e) annealing the entire substrate at a temperature below 1200° C., in an atmosphere devoid of water vapor, and at an elevated pressure sufficient to cause rearrangement of the silicon oxide film and thereby densify the silicon oxide film; and (f) leveling the silicon oxide film by chemical and mechanical polishing (CMP) in such a manner that the silicon oxide film remains only in the trenches.

11. A method according to claim 10, wherein said silicon nitride film is formed to a thickness of approximately 50 to 100 angstroms.

12. A method according to claim 10, wherein said forming of the silicon nitride film includes etching the silicon nitride film with its unetched part covering only the sidewalls of the trenches.

13. A method according to claim 10, further comprising the step of washing the entire substrate with a solution containing fluoric acid after said leveling step.

14. A method according to claim 10, wherein said silicon oxide film comprises an undoped silicon oxide film.

* * * * *